United States Patent [19]

Rich et al.

[11] 4,131,042

[45] Dec. 26, 1978

[54] APPARATUS FOR CUTTING AND REMOVING DRY FILM PHOTORESIST FROM PRINTED WIRE BOARDS

[75] Inventors: Dennis E. Rich, Riverton, Utah; Conrad J. Steigerwald, Phoenix, Ariz.

[73] Assignee: Honeywell Information Systems Inc., Phoenix, Ariz.

[21] Appl. No.: 864,562

[22] Filed: Dec. 27, 1977

[51] Int. Cl.² .......................... B26F 1/02; B21D 45/02
[52] U.S. Cl. .......................................... 83/100; 83/125; 83/126; 83/152; 83/563
[58] Field of Search ..................................... 83/98–100, 83/123–128, 152, 563

[56] References Cited

U.S. PATENT DOCUMENTS

| | | | |
|---|---|---|---|
| 415,477 | 11/1889 | Stevens | 83/127 |
| 1,493,994 | 5/1924 | LeFese | 83/124 |
| 2,251,135 | 7/1941 | Iknayan et al. | 83/124 X |
| 3,568,554 | 3/1971 | Wiechec | 83/98 |

Primary Examiner—J. M. Meister
Attorney, Agent, or Firm—Edward W. Hughes; William W. Holloway, Jr.; Ronald T. Reiling

[57] ABSTRACT

Apparatus for cutting and removing layers of photoresist overlaying tooling holes in a printed wire board blank. A lower cutter is mounted on a base so that its cutting edge projects above the upper surface of the base a distance substantially equal to the thickness of a layer of photoresist. A cutter head is mounted on the base for movement parallel to the upper surface of the base. An upper cutter is mounted on the cutter head for movement by a cutter actuator to cause the upper and lower cutters to sever segments of layers of photoresist overlaying a tooling hole of a PWB blank positioned between them. Each cutter is provided with a plunger movable within their respective cutters. The upper surface of the lower plunger, when the lower plunger is retracted, projects above the lower cutting edge of the lower cutter; and the upper plunger is biased downwardly so that its bottom surface projects below the cutting edges of the upper cutter. As a result the plungers stress the photoresist layers overlaying a tooling hole prior to the upper and lower cutters engaging them. A plunger actuator then moves the lower plunger toward the upper plunger pressing the severed segments together and against the upper plunger. The upper plunger has a conduit connected to a source of vacuum to cause the two segments, which adhere to one another, to adhere to the upper plunger. The upper cutter is retracted and the cutter head moved to place the upper cutter over a disposal opening in the base. The conduit is then connected to a source of compressed air to discharge the segments into the disposal opening.

10 Claims, 9 Drawing Figures

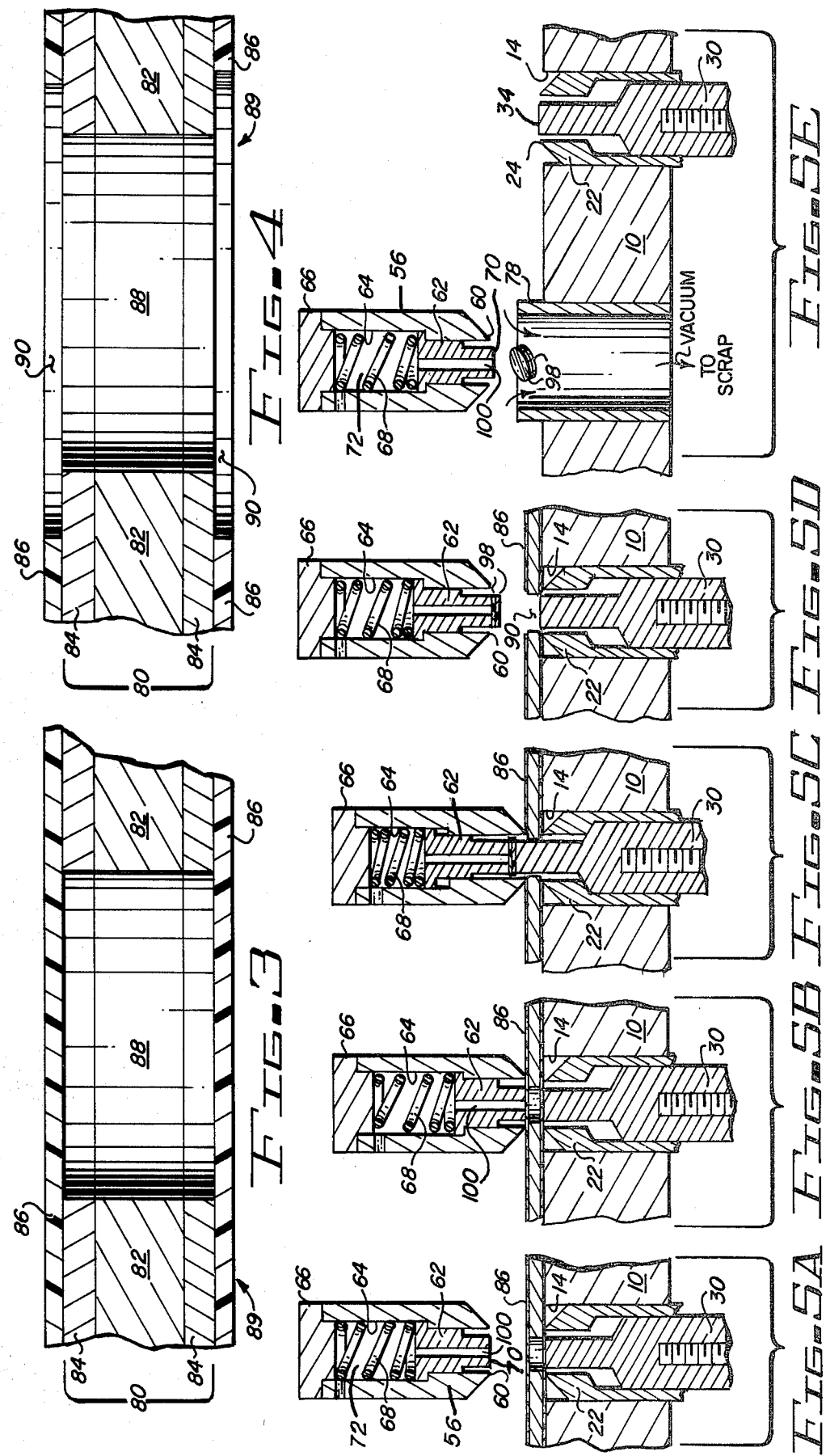

APPARATUS FOR CUTTING AND REMOVING DRY FILM PHOTORESIST FROM PRINTED WIRE BOARDS

BACKGROUND OF THE INVENTION

1. Field of the Invention

This invention is in the field of cutting apparatus and more particularly relates to apparatus for cutting segments of layers of dry film photoresist overlaying tooling holes of printed wire circuit blanks and for removing these segments.

2. Description of the Prior Art

In electronic systems, particularly those which are relatively complex, there is a need for compact arrangements of components of such circuits. The components are frequently mounted on printed wire boards (PWB)s and interconnected by conductors produced on such (PWB)s by photolithographic processes. Such processes start with a PWB blank, a thin laminate, or base, of epoxy glass, for example, with its upper and lower surfaces covered with a thin layer of copper. The PWB blanks are provided with a number of tooling holes, three to five, for example, which are used to precisely position the blanks in order that the individual conductors when produced will be precisely positioned.

After the tooling holes have been drilled in a PWB blank, and any other holes that are to be formed in the blank have been drilled and plated with copper, the next step in the process of producing finished PWBs is to apply layers of dry film photoresist over the copper layers of PWB blanks. The two layers of photoresist are then laminated to the blank by the application of pressure and heat. The dry film photoresist has a coating of adhesive material which secures the layers of dry film photoresist to a PWB blank.

In the process of applying the layers of photoresist to a PWB blank, the tooling holes of the blank are covered. To convert a PWB blank into a finished PWB, it is necessary to expose the photoresist to a source of radiant energy, to develop the exposed photoresist film, to etch the copper that is to be removed to produce conductors, and to strip away the remains of the photoresist on the PWB. However, to properly expose the photoresist so that the conductors will be formed where intended with the proper degree of precision, it is necessary that the tooling holes be accessible so that they can be used to properly position the PWB blank.

The prior art way of removing layers of dry film photoresist overlaying, or covering, tooling holes of the PWB blank has been by individual operators using a knife to cut the layers. The segments of the photoresist layers are then removed by hand.

There are two problems with the prior art manner of removing layers of dry film photoresist overlaying tooling holes, one is that it takes a substantial amount of time to perform this operation with acceptable precision. In addition, the heat and the pressure applied to laminate photoresist layers to a PWB blank causes the photoresist to become brittle. Thus, in cutting the layers of photoresist overlaying a tooling hole, flakes or particles of the photoresist are frequently produced. If these particles are not detected and removed they will cause shorts to be produced between separate conductors formed on a finished PWB. The necessity for removing these particles increases the cost of removing photoresist overlaying tooling holes, and to the extent such particles are not completely removed, additional work is required to correct the resulting shorts which further increases the cost of the operation.

SUMMARY OF THE INVENTION

The present invention provides apparatus which automates the cutting and removal of segments of photoresist layers overlaying tooling holes in a PWB blank. The apparatus is provided with a base having a planar upper surface on which a PWB blank with layers of photoresist laminated to it is placed. A hollow cylindrical lower cutter with a circular cutting edge is mounted on the base so that the cutting plane of its cutting edge lies above the upper surface of the base a distance substantially equal to the thickness of a layer of dry film photoresist laminated to one side of the PWB blank. The lower cutter is adjustably mounted on the base to accommodate photoresist layers of different thicknesses.

A cutter head is mounted on the base a fixed distance above the upper surface and so that the cutter head can move laterally above the base. A cutter head actuator is provided to move the cutter head from a first position to a second position and back to the first. An upper hollow cylindrical cutter is mounted on the cutter head for reciprocal linear motion substantially perpendicular to the upper surface of the base. The cutter head in its first position is located so that the cutting edge of the upper and lower cutters are essentially opposed to one another. An upper cutter actuator is mounted on the cutter head to move the upper cutter from its retracted position to its extended position in which the cutting edges of the cutters are spaced apart a distance substantially equal to the thickness of a PWB blank placed between them. The upper cutter is provided with an upper plunger that is movably mounted within the upper cutter. The upper plunger is biased downwardly so that its bottom surface projects slightly below the plane of the cutting edge of the upper cutter. A conduit is formed in the upper plunger which is adapted to be connected at one time to a source of vacuum and at other times to a source of compressed air. The lower cutter is provided with a lower plunger movably mounted within the lower cutter. A plunger actuator is mounted on the lower cutter and connected to the lower plunger to move the plunger from a retracted position in which its top surface projects slightly above the plane of the cutting edge of the lower cutter to an extended position in which its top surface is moved vertically to a position where it could contact the lower surface of the upper plunger. The cutter actuator is energized to drive the upper cutter toward the lower cutter with sufficient force to sever the layers of dry film photoresist on a PWB blank overlaying a tooling hole. The lower plunger is then moved to its extended position by the plunger actuator which causes the severed segments from the layers of photoresist to be forced into contact with each other and against the upper plunger. A source of vacuum is connected to the upper conduit to cause the two segments to adhere to the upper plunger. The upper cutter and with it the upper plunger are retracted. The cutter head is moved by the cutter head actuator so that the cutter head is in its second position where it is over a disposal opening formed in the base. A source of compressed air is then connected to the conduit in the upper plunger to discharge the segments adhering to it into the disposal opening. The cutter head actuator is then energized to move the cutter head back to its first position.

It is an object of this invention to provide apparatus for cutting and removing the outer laminations of a laminated board, particularly the segments of such laminations overlaying an opening in said board.

It is another object of this invention to provide apparatus for automating the removal of layers of dry film photoresist overlaying tooling holes in a PWB blank.

It is still another object of this invention to provide apparatus for removing layers of dry film photoresist overlaying tooling holes of a PWB blank so that no debris or flakes of the photoresist are produced or left on the layers of photoresist of the blank.

It is another object of this invention to provide apparatus for cutting and removing layers of dry film photoresist from printed wire circuit boards at a cost that is significantly less than the cost of performing the same operation by hand.

BRIEF DESCRIPTION OF THE DRAWINGS

Other objects, features and advantages of the invention will be readily apparent from the following description of the preferred embodiment thereof, taken in conjunction with the accompanying drawings, although variations and modifications may be effected without departing from the spirit and scope of the novel concepts of the disclosure, and in which:

FIG. 3 is an enlarged fragmentary section through a PWB blank laminated with dry film photoresist layers overlaying a tooling hole formed in the blank.

FIG. 4 is a view similar to that of FIG. 3 taken after the segments of the layers of photoresist overlaying a tooling hole have been removed.

FIGS. 5A through 5E are fragmentary sectional views illustrating schematically the operation of the apparatus of the invention.

DESCRIPTION OF THE PREFERRED EMBODIMENT

Figure 1:
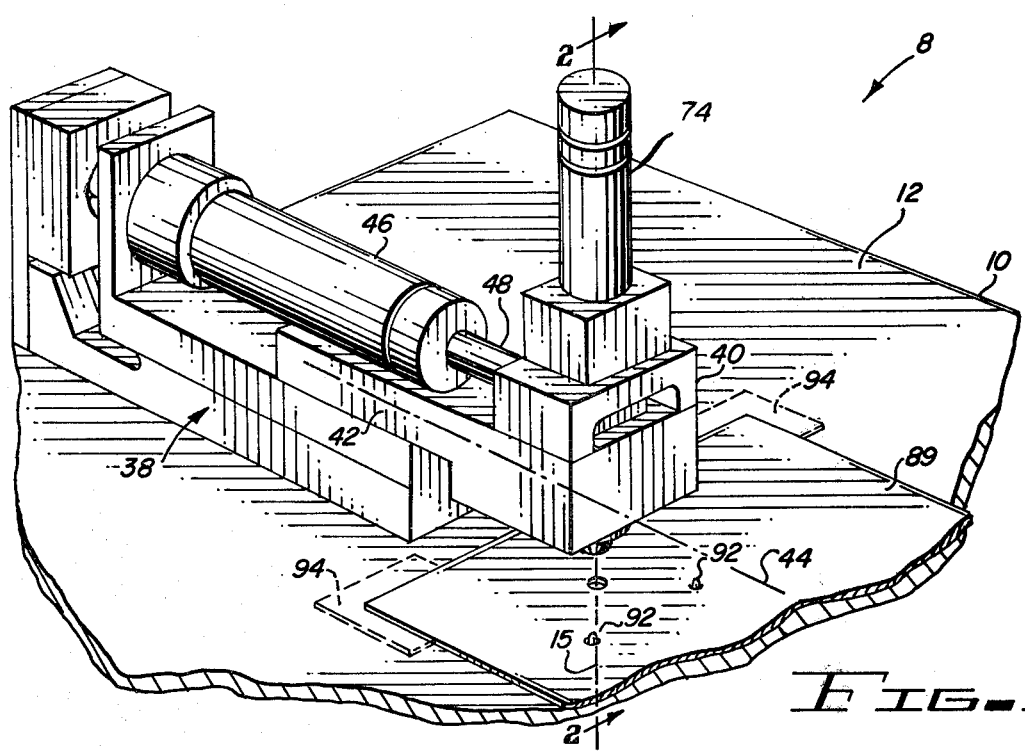
FIG. 1 is a perspective view of the apparatus of the invention.
Figure 2:
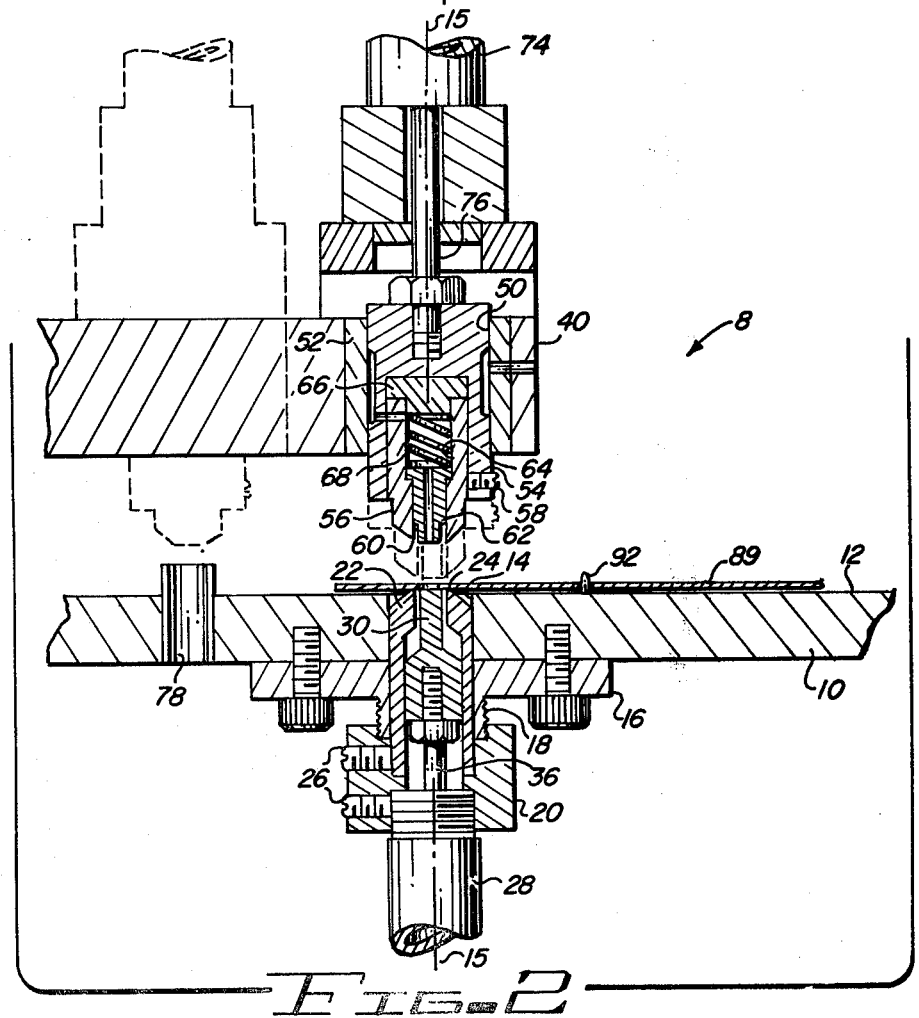
FIG. 2 is a section taken on line 2—2 of FIG. 1.

Referring to FIGS. 1 and 2, apparatus 8 has a base plate, or base 10, of steel, for example, which has an upper surface 12 that is substantially planar. Base 10 is mounted on a table, or support, which is not illustrated, so that surface 12 is substantially horizontal and at a convenient elevation for an operator to use it. A cylindrical cutter opening 14 is formed through base 10 as seen in FIG. 2. Cutter opening 14, in a preferred embodiment, has a circular cross section and the axis 15 of opening 14 is substantially perpendicular to the top surface 12 of base 10. A cutter holder 16 is secured to the bottom surface of base 10 by bolts, for example. Cutter holder 16 is provided with an externally threaded boss 18 onto which is threaded adapter 20. A hollow cylindrical lower cutter 22 whose cutting edge 24 defines a closed figure in a lower cutter plane is positioned in cutter opening 14 so that its lower cutter plane is spaced a predetermined distance above the upper surface 12 of base 10 and is substantially parallel to surface 12. Cutter 22 is held in cutter opening 14 by set screw 26 so that the distance that the cutter plane is spaced above the upper surface 12 of base 10 can be adjusted. Cutter 22 is fixedly held in opening 14 once it is positioned the right distance by set screw 26. Plunger actuator 28, a conventional pneumatic cylinder in the preferred embodiment, is mounted on adapter 20. Cutter 22 is hollow as can be seen in FIG. 2, for example, and lower plunger 30 is mounted in cutter 22 for linear motion substantially parallel to longitudinal axis 15 of opening 14. Plunger 30 is substantially symmetric with respect to axis 15 and is provided with a top surface 34 which is substantially perpendicular to axis 15 as is better seen in FIG. 5E, for example. Lower plunger 30 is secured to the piston rod 36 of actuator 28. Plunger 30 has two positions, a retracted position in which its top surface is slightly above the plane determined by the cutting edge 24 of cutter 22 as seen in FIG. 5E and an extended position in which the top surface 34 extends well above the plane of cutting edge 24 as seen in FIG. 5C, for example.

A conventional slide 38 is mounted on the top surface 12 of table 10. Cutter head 40 is mounted on movable element 42 of slide 38. Slide 38 is positioned on base plate 10 so that cutter head 40 is at a substantially fixed distance above the upper surface 12 of base 10 and can move linearly in a direction along slide axis 44 of slide 38. A conventional cutter head actuator 46, in a preferred embodiment, a pneumatic cylinder, is mounted on base 10 and has its piston rod 48 operatively connected to cutter head 40. Cutter head 40 has an upper cutter bore 50 formed in it and an upper cutter bushing 52 is positioned in bore 50. An upper cutter adapter 54 is mounted in bushing 52 for reciprocal linear motion therein. Upper hollow cylindrical cutter 56 is provided with a circular cutting edge 60. The diameter of cutting edge 60 substantially equals the diameter of cutting edge 24 of lower cutter 22. Upper cutter 56 is positioned in cutter head 40 so that the longitudinal axis of upper cutter 56 substantially coincides with axis 15 of lower cutter opening 14 when cutter head 40 is positioned as illustrated in FIGS. 1 and 2. An upper plunger 62 is mounted for linear motion substantially parallel to the longitudinal axis of upper cutter 56 in central bore 64 of upper cutter 56. The top of bore 64 of cutter 56 is blocked by plug 66. A conventional coil spring 68 is positioned between plug 66 and plunger 62 to bias plunger 62 downwardly. Plunger 62 is provided with a lower surface 70 which is substantially perpendicular to the axis of upper cutter 56 and in its extended position is spaced slightly below the plane determined by cutting edge 60 of upper cutter 56. Interconnecting passages, or bores, are formed through cutter head 40, bushing 52, cutter adapter 54 and cutter 56 to provide communication with chamber 72 formed between the upper surface of upper plunger 62, plug 66 and the walls of bore 64 of cutter 56. As a result the pressure in chamber 72 can be made to be above or below ambient atmospheric pressure by connecting chamber 72 to a source of vacuum, a vacuum pump, or to a source of compressed air such as a compressed air pump using conventional tubing and valves and pumps as is well known in the art and therefore are not illustrated.

Upper cutter actuator 74 is mounted on cutter head 40 and its piston rod 76 is connected to cutter adapter 54. Upper cutter 56 has two positions, a retracted position in which its cutting edge 60 is well above the upper surface 12 of base 10 as seen in solid lines in FIG. 2, for example, and a second, or extended position, in which its cutting edge 60 is spaced from the cutting edge 24 of lower cutter 22 by predetermined distance as seen in FIG. 5B, for example.

A waste disposal opening or chute 78 is formed through base 10. Cutter head 40 has two positions, a first position in which the cutting edge 60 of upper cutter 56 is substantially directly opposed to the cutting edge of lower cutter 22 with the centers of cutting edges 24 and 60 lying on axis 15 as illustrated in FIG. 2, and a second position in which cutter head 40 is positioned so that upper cutter 56 is directly over chute 78 as is illustrated by dotted lines in FIG. 2.

Referring to FIG. 3, which is not to scale, a printed wire board blank 80 is schematically illustrated. Blank 80 has a thin sheet of material, or a base, 82 on the upper and lower surfaces of which thin layers of copper 84 have been formed. The thickness of base 82 typically ranges from 5 to 10 mils to 60–70 mils. The thickness of copper layers 84 typically is in the range of from 2 to 3 mils. To photolithographically form conductor runs from copper layers 84, layers of dry film photoresist 86 are placed over the two copper layers 84 of PWB blank 80 and overlay tooling hole 88 formed in PWB blank 80 as is illustrated in FIG. 4. Photoresist layers 86, particularly the surfaces that contact copper layers 84, are provided with a thin coating of an adhesive which causes the photoresist layers 86 to adhere to copper layers 84. In addition, heat and pressure are applied to the photoresist layers 86, after they have been placed on a PWB blank 80, to produce laminated board 89.

In FIG. 4 segments of dry film photoresist layers 86 overlaying tooling hole 88 have been excised and removed by apparatus 8. The openings 90 formed by apparatus 8 in layers 86 are substantially concentric with the perimeter of tooling hole 88. The diameter of opening 90 is slightly greater than the diameter of tooling hole 88 as is seen in FIG. 4.

In operation, a laminated PWB blank 89, consisting of a PWB blank 80 with photoresist layers 86 laminated to its upper and lower surfaces, is positioned on the upper surface 12 of base 10 so that the center of circular tooling hole 88 lies substantially on axis 15. Actuator 46 will be energized to move the cutter head 40 to its first position so that the axis of the upper cutter 56 substantially coincides with the axis 15 as shown in FIG. 2. Locating pins 92, or positioning jigs 94, can be used to properly position laminated PWB board 89 so that its tooling hole 88 is between the upper and lower cutters as illustrated in FIG. 1, and so that the center of tooling hole 88 substantially lies on axis 15 as illustrated in FIG. 2. When laminated PWB board 89 is properly positioned with respect to the upper and lower cutting heads, the operator energizes upper actuator 74 to move upper cutter 56 downwardly. Since lower plunger 30 and upper plunger 62 both project beyond the cutting edges of the upper and lower cutters, the plungers contact photoresist layers 86 before the cutting edges to tension them, which assists in cutting segments 98 of the photoresist layers that overlay tooling hole 88 and minimizes the number of fragments of photoresist layers 86 produced. After the upper and lower layers 86 of the photoresist overlaying tooling hole 88 have been tensioned by plungers 30 and 62, upper cutter 56 continues to move downwardly until its cutting edge 60 engages upper photoresist layer 86 on the laminated PWB 89 and causes the cutting edge 24 of lower cutter 22 to cut through the lower layer of photoresist laminated to the laminated board 89. The cutters are adjustably mounted so that the upper cutter in its extended position is spaced from the edge 24 of the lower cutter a distance that substantially equals the thickness of a PWB blank 80.

The initial positions of the upper and lower cutters are illustrating schematically in FIG. 5A. Actuation of pneumatic cylinder 74 causes upper cutter 56 to move to the position illustrated in FIG. 5B. The lower circuit head 22 remains fixed. Actuator 74 applies enough force to push the two cutter heads together so that they will both penetrate and sever substantially all of photoresist layers 86 on laminated PWB board 89. After actuator 74 has forced the upper cutter 56 to its extended position, plunger actuator 28 is energized to move lower plunger 30 upwardly as seen in FIG. 5C. The movement of lower plunger 30 upwardly causes the segments 98 severed from layers 86 to be forced together and the two are then forced against the lower surface 70 of upper plunger 62 as illustrated in FIG. 5C. At that time, chamber 72 is connected to a source of vacuum so that the pressure within chamber 72 is reduced which will hold segments 98 against surface 70 of the upper plunger 62 through the pressure drop transmitted through the central opening 100 formed in upper plunger 62. Upper actuator 74 is then energized to retract upper cutter 56 which also retracts the upper plunger 62 to remove the severed segments 98 from laminated board 89. Cutter head actuator 46 is then energized to move the cutter head 40 so that it is in its second position substantially directly over waste diposal opening 78. The source of vacuum is then disconnected from chamber 72 and a source of compressed air is connected to chamber 72 to cause segments 98 to be discharged into waste disposal chute 78.

Laminated board 89 is now moved to place another tooling hole 88 so that the center of that tooling hole substantially coincides with the axis 15 and the cycle of operation of apparatus 8 is ready to be repeated.

The plungers 30 and 62 project beyond the cutting edges, respectively, a distance about 3 to 4 times the thickness of the layer of photoresist. In a preferred embodiment, layers 86 are substantially 3.5 mils thick and the plungers 30 and 62 project beyond the cutting edges 24 and 60 substantially 15 mils. The lower plunger, when it is moved from its retracted position to its extended position, is moved a distance which is substantially equal to twice the thickness of the laminated PWB board 89.

In describing the apparatus of this invention, it has been illustrated and described as having circular cutting edges for cutting circular segments from the photoresist layers of a laminated board. It should be obvious that the particular shape of the cutters can be modified to coincide with the shape of the tooling holes.

From the foregoing it is believed apparent that the applicants apparatus provides a machine for automating the process of cutting and severing photoresist layers laminated to a printed wire board, particularly segments of the photoresist layers that overlay tooling holes. In doing this, the apparatus significantly reduces the risk of fragments of photoresist from contaminating the surfaces of a laminated board while reducing the time required to accurately remove segments overlaying tooling holes. The apparatus, while primarily intended for use in removing layers of photoresist overlaying tooling holes of PWBs, could be modified to be used in removing the outer layers of laminated objects overlaying openings formed in such objects.

What is claimed is:

1. Apparatus for cutting and removing from a laminated board having a base, with an opening through the base, segments of the outer laminations overlaying said opening, comprising:

a base plate having an upper planar surface;
   a lower cutter having a cutting edge, said cutting edge substantially defining a lower cutter plane;

means for mounting the lower cutter on the base plate so that the lower cutter plane projects above the planar surface of the base plate a predetermined distance;

a lower plunger having a top surface mounted for movement within said lower cutter, said lower plunger having an extended position and a retracted position;

a cutter head mounted on the base plate at a substantially fixed distance above the upper surface of the base plate;

an upper cutter having a cutting edge, said cutting edge of the upper cutter defining an upper cutter plane;

means for mounting said upper cutter on said cutter head for linear reciprocal movement between a retracted positon and an extended position in which the upper cutter plane is spaced a predetermined distance from the lower cutter plane;

an upper plunger having a lower surface mounted for linear movement in said upper cutter;

bias means for biasing said upper plunger toward said base;

cutter actuator means for moving the upper cutter from its retracted to its extended position;

plunger actuator means for causing said lower plunger to move from its retracted to its extended position, the top surface of said lower plunger being capable of contacting the lower surface of the upper plunger when the upper cutter and the lower plunger are in their extended positions; and conduit means formed in said upper cutter, said conduit means adapted to be connected to a source of vacuum to cause material severed by said cutters to adhere to the upper plunger.

2. Apparatus as defined in claim 1 in which the cutting edges of the upper and lower cutters are circular and have substantially the same diameter.

3. Apparatus for cutting and removing from a laminated board having a base and outer layers, said base having an opening through it and the outer layers overlaying said opening comprising:

a base plate having an upper planar surface;

a lower hollow cutter having cutting edges, said cutting edges substantially defining a closed figure in a lower cutter plane;

means for mounting the lower cutter on the base plate so that the lower cutter plane is substantially parallel to and spaced above the planar surface of the base plate a distance substantially equal to the thickness of an outer layer of said laminated board overlaying an opening;

a lower plunger having a top surface mounted for movement within said lower cutter, said lower plunger having an extended position and a retracted position, the top surface of said lower plunger when in its retracted position projecting above the lower cutter plane;

a cutter head mounted on the base plate at a substantially fixed distance above the upper surface of the base plate;

an upper hollow cutter having cutting edges, said cutting edges defining a closed figure in an upper cutter plane;

means for mounting said upper cutter on said cutter head for linear reciprocal movement between a retracted position and an extended position, said upper cutter plane when the upper cutter is in its extended position being substantially parallel to and spaced from the lower cutter plane a distance substantially equal to the thickness of the base of a laminated board;

an upper plunger having a lower surface mounted for linear movement in said upper cutter between a retracted position and an extended position;

means for biasing said upper plunger to is extended position so that its lower surface projects below the upper cutter plane;

cutter actuating means for moving the upper cutter from its retracted to its extended position;

plunger actuator means for causing said lower plunger to move from its retracted to its extended position, said plunger adapted to force segments of the outer layers overlaying the opening of the laminated board severed by the upper and lower cutters when such a board is placed between said cutters with the opening in the base within the figures defined by the cutting edges of the upper and lower cutters, and placing said segments in contact with the lower surface of the upper plunger; and means for causing the segments of the outer lamination layers severed by the cutters to adhere to the lower surface of the upper plunger.

4. Apparatus as defined in claim 3 in which the opening in the base has a circular cross sectional area having a first diameter, the closed figures defined by the cutting edges of the upper and lower cutters are circles having second diameters that are substantially equal to each other and the diameter of the cutting edges of the upper and lower cutters are greater than said first diameter.

5. Apparatus for cutting and removing segments of photoresist layers overlaying tooling holes in a PWB blank comprising:

a base plate having an upper planar surface;

a lower hollow cylindrical cutter having a circular cutting edge, said cutting edge substantially defining a lower cutter plane;

means for mounting the lower cutter on the base plate so that the lower cutter plane extends above the planar surface of the base plate a distance substantially equal to the thickness of a layer of photoresist;

a lower plunger having a top surface mounted for movement within said lower cutter, said plunger having an extended position in which the top surface of the plunger extends above the lower cutter plane a distance greater than the thickness of the PWB blank, and a retracted position in which said top surface projects above the lower cutter plane a distance greater than the thickness of a layer of photoresist in the PWB blank;

a cutter head mounted on said base plate at a substantially fixed distance above the upper surface of the base plate;

an upper hollow cylindrical cutter having a circular cutting edge, said cutting edge defining an upper cutter plane;

means for mounting said upper cutter on said cutter head for linear reciprocal movement between a retracted position and an extended position in which said upper cutter plane is spaced from the lower cutter plane a distance substantially equal to the thickness of a printed wire board blank;

an upper plunger having a lower surface, said upper plunger being mounted in said upper cutter for linear movement between a retracted position and an extended position;

means for biasing said upper plunger toward its extended position in which its lower surface extends a predetermined distance below the upper cutter plane;

cutter actuating means for moving the upper cutter from its retracted position to its extended position to excise segments of photoresist layer overlaying a tooling hole of a PWB blank placed between the upper and lower cutters;

plunger actuator means for causing said lower plunger to move from its retracted to its extended position to force the severed segments of the photoresist layers together and against the lower surface of the upper plunger; and means for causing the segments to adhere to the upper plunger when the upper cutter is moved to its retracted position.

6. Apparatus as defined in claim 5 in which the cross sectional area of the tooling holes formed in a PWB blank is circular and the diameter of which substantially equals a first diameter, the diameter of the circular cutting edges of the lower and upper cutters are substantially equal to a second diameter, and the second diameter is greater than the first.

7. Apparatus as defined in claim 5 in which the means for causing the segments to adhere to the upper plunger is a source of air at less than ambient pressure.

8. Apparatus for cutting and removing segments of photoresist layers overlaying tooling holes of PWB blank, said tooling holes having a circular cross section, a center, and a diameter, the layers of photoresist being of a substantially equal thickness and said PWB blank having a substantially uniform thickness comprising:

a base plate having an upper planar surface;

a lower hollow cylindrical cutter having a circular cutting edge having a diameter and a center, said cutter edge substantially defining a lower cutter plane;

means for mounting the lower cutter on the base plate so that the lower cutter plane extends above the planar surface of the base plate a distance substantially equal to the thickness of a layer of photoresist;

a lower planar having a top surface mounted for linear movement within said lower cutter, said plunger having an extended position in which the top surface of the plunger extends above the lower cutter plane a predetermined distance, and a retracted position in which the top surface of the lower plunger projects above the lower cutter plane a distance greater than the thickness of a layer of photoresist;

a cutter head movably mounted on said base plate at a substantially fixed distance above the upper surface of the base plate for movement from a first position to a second position;

an upper hollow cylindrical cutter having a circular cutting edge having a diameter and a center, said cutting edge defining an upper cutter plane;

means for mounting said upper cutter on said cutter head for linear reciprocal movement between a retracted position and an extended position in which said upper cutter plane is spaced from and substantially parallel to the lower cutter plane at a distance substantially equal to the thickness of a PWB blank;

an upper plunger having a lower surface, said upper plunger being mounted in said upper cutter for linear movement from a retracted position to an extended position;

means for biasing said upper plunger toward its extended position in which its lower surface extends a predetermined distance below the upper cutter plane;

cutting actuating means for moving, when the cutter head is in its first position, the upper cutter from its retracted position to its extended position to excise segments of photoresist layers overlaying a tooling hole of a PWB blank placed between the upper and lower cutters with the center of a tooling hole substantially lying on a line through the centers of said upper and lower cutting edges, the diameter of the upper and lower cutting edges being substantially equal and greater than the diameter of the tooling hole;

plunger actuator means for causing said lower plunger to move from its retracted to its extended position to force the severed segments of the photoresist layers together and against the lower surface of the upper plunger;

means for causing the segments to adhere to the upper plunger with the upper cutter is moved to its retracted position;

means for moving said cutter head from its first position to its second position;

disposal means formed in said base plate substantially directly under the upper cutter when said cutter head is in its second position; and means for causing the segments adhering to the upper plunger to be discharged into said disposal means.

9. Apparatus as defined in claim 8 in which the predetermined distance the lower surface of the upper plunger extends below the upper cutter plane when in its extended position is greater than the thickness of a layer of photoresist overlaying a tooling hole.

10. Apparatus as defined in claim 9 in which the means for causing segments to adhere to the upper plunger include a source of air at less than ambient pressure, and the means for causing the segments adhering to the upper plunger to be discharged into said disposal means include a source of compressed air.

* * * * *